US012702011B2

(12) United States Patent (10) Patent No.: US 12,702,011 B2
Chen et al. (45) Date of Patent: Aug. 4, 2026

(54) ANTENNA PROTECTION ON DUMMY METAL FILLS

(71) Applicant: Micron Technology, Inc., Boise, ID (US)

(72) Inventors: Hao Chen, Boise, ID (US); Raja Kumar Varma Manthena, Boise, ID (US); Surendranath C. Eruvuru, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 842 days.

(21) Appl. No.: 17/752,647

(22) Filed: May 24, 2022

(65) Prior Publication Data

US 2023/0402407 A1 Dec. 14, 2023

(51) Int. Cl.
*H10W 42/60* (2026.01)
*H10W 42/00* (2026.01)
(52) U.S. Cl.
CPC .......... *H10W 42/60* (2026.01); *H10W 42/00* (2026.01)

(58) Field of Classification Search
None
See application file for complete search history.

(56) References Cited

U.S. PATENT DOCUMENTS

| | | | |
|---|---|---|---|
| 10,211,168 B1 * | 2/2019 | Chavali | H01L 23/60 |
| 2018/0166490 A1 * | 6/2018 | Wakiyama | H01L 24/05 |

* cited by examiner

*Primary Examiner* — Dale E Page
*Assistant Examiner* — Patrick Cullen
(74) *Attorney, Agent, or Firm* — Dorsey & Whitney LLP

(57) ABSTRACT

A memory device can include a semiconductor substrate having a plurality of active semiconductor devices. The memory device can include a plurality of metallization layers disposed over the semiconductor substrate, where each of the plurality of metallization layers is separated from adjacent metallization layers by an interlayer dielectric. The memory device also includes a dummy metal fill disposed in a metallization layer. The dummy metal fill can be connected to a discharge path for dissipating a charge build up in the dummy metal fill to minimize antenna effects. In some embodiments, the discharge path can include the semiconductor substrate, which can be an electrical drain. The antenna protected dummy metal fill ensures is configured such that any accumulated charge during the fabrication process is discharged to the electric drain.

15 Claims, 9 Drawing Sheets

OVAL    CIRCLE    "L" SHAPE    TRAPEZOID

PLUS    "X" SHAPE    RECTANGLE    SQUARE    TRIANGLE

800

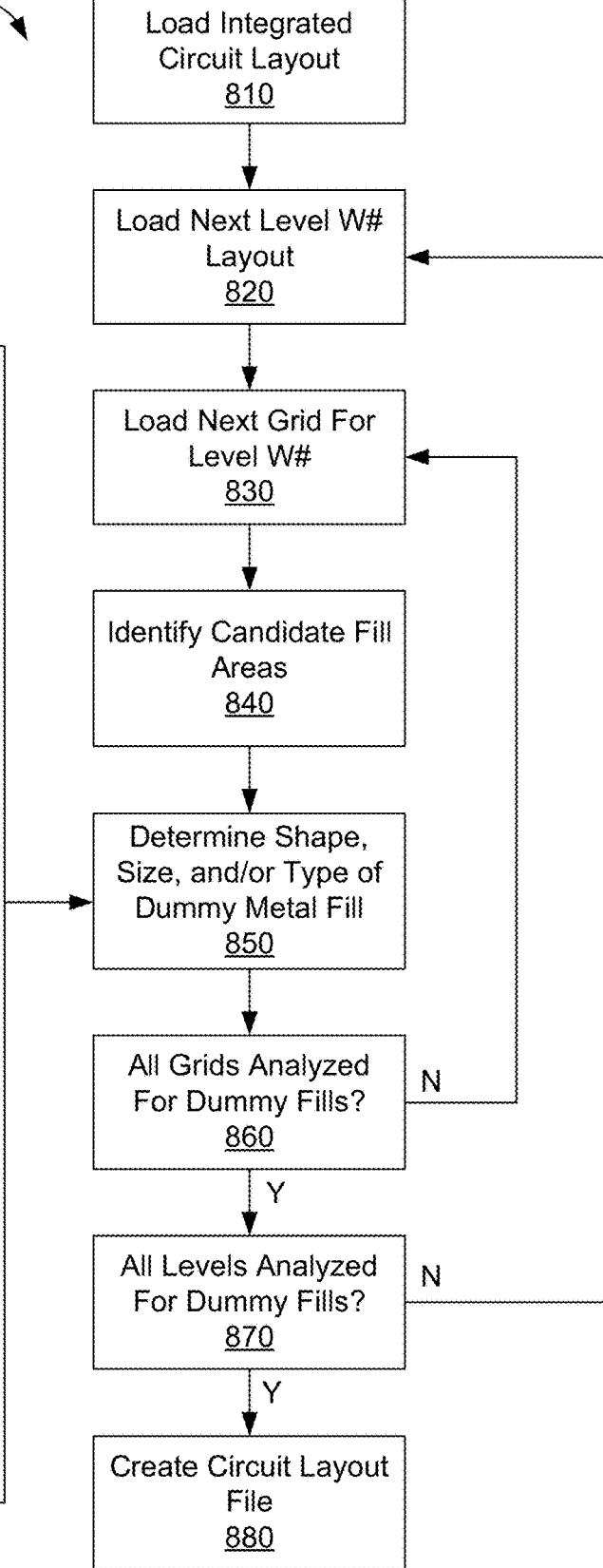

DESIGN RULES

Determination Rules for Shape/Size
1. Determine shape of fill based on surrounding live metal (e.g., shape of dummy fill candidate area), and/or
2. Determine size of fill based on:
   a. Density limits (Min. – Max.),
   b. Minimum distance to live metal, and/or
   c. size of area to fill (e.g., size of dummy fill candidate area).
3. Custom-create shape/size and/or select one or more template shapes/sizes based on determinations.

Determination Rules for Type
1. Add via-based dummy fill, if there is lower drain path:
   a. determine placement of via,
   b. determine number of vias.
2. Add same level merge fill, if same level drain path and no lower drain path.
   a. determine size of merge fill,
   b. determine effective contact area.
3. If Rules permit, add floating dummy fill using conventional rules if no drain path.

855

Load Integrated Circuit Layout
810

Load Next Level W# Layout
820

Load Next Grid For Level W#
830

Identify Candidate Fill Areas
840

Determine Shape, Size, and/or Type of Dummy Metal Fill
850

All Grids Analyzed For Dummy Fills?
860          N

Y

All Levels Analyzed For Dummy Fills?
870          N

Y

Create Circuit Layout File
880

*FIG. 8A*

ANTENNA PROTECTION ON DUMMY METAL FILLS

TECHNICAL FIELD

The disclosed embodiments relate to memory devices. More particularly, this invention relates to memory devices in which dummy metal fills are protected from antenna effects.

BACKGROUND

Memory devices are typically provided as internal, semi-conductor, integrated circuits in computers or other electronic devices. There are many different types of memory including random-access memory (RAM), read only memory (ROM), dynamic random access memory (DRAM), synchronous dynamic random access memory (SDRAM), static random access memory (SRAM), and flash memory. A memory device can include a semiconductor substrate with one or more memory cell arrays and support-ing logic circuits located on the peripheral area adjacent the memory cell arrays. The fabrication of memory devices includes the deposition of many layers that include, for example, oxide layers, polysilicon layers, metallization lay-ers, interlayer dielectric layers, etc. The memory device can include active semiconductor devices such as, for example, memory cell arrays and/or associated logic circuits and/or associated interconnecting metal (referred to herein a "live metal"). In addition, the memory device can include dummy metal fills that are deposited during the fabrication process to mitigate defects (e.g., dishing, erosion, etc.) in the various layers of a memory device that can be caused by, for example, processes such as chemical-mechanical polishing (CMP). The dummy metal fills, however, can accumulate a charge (referred to herein as "antenna effect") due to, for example, processes such as plasma etching. Because these dummy metal fills have no connection to discharge the accumulated charge (referred to herein as "floating dummy metal fills"), the accumulated charge does not dissipate (or dissipates very slowly) and can cause components within the memory device to fail. Currently, dummy metal fills are not protected from antenna effects. This is because the dummy nets do not have a hierarchy, which means that there is no standard layout and the dummy metal fill layout in a memory device is random. Thus, it could take months, if not longer, to manually identify and protect all the dummy metal fills within a memory device.

For the reasons stated above, and for other reasons stated below which will become apparent to those skilled in the art upon reading and understanding the present specification, there is a need in the art for to provide antenna protection for dummy metal fills.

BRIEF DESCRIPTION OF THE DRAWINGS

FIG. 8A shows a flow chart for determining a shape, size, and/or type of dummy metal fill to be used in a candidate fill area in accordance with the present disclosure.

DETAILED DESCRIPTION

Figures 1A, 1B, 1C, 1D:
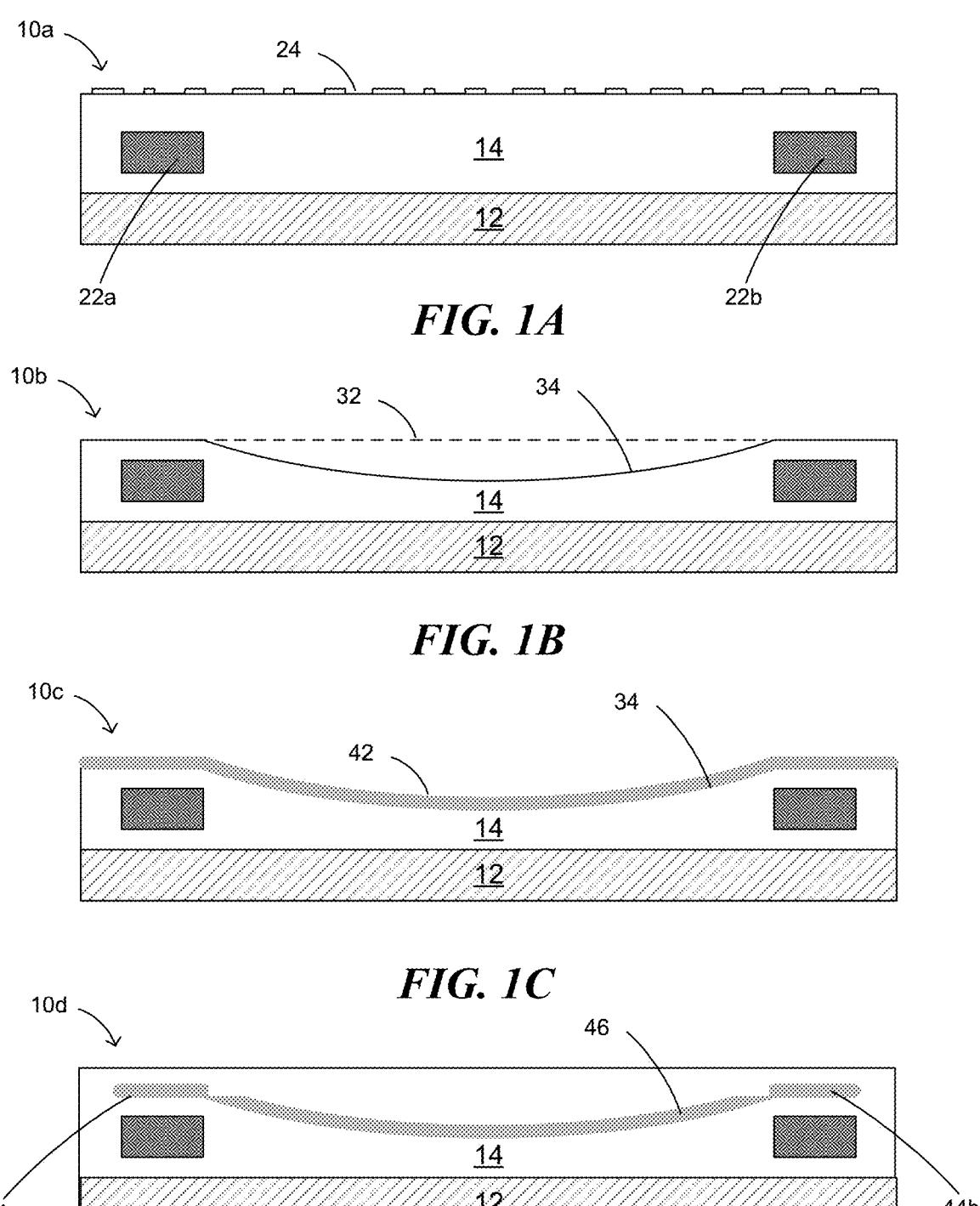
FIGS. 1A to 1D are simplified cross-sectional views of a portion of a memory device during various stages of fabri-cation.

In the following detailed description, reference is made to the accompanying drawings that form a part hereof, and in which is shown, by way of illustration, specific embodi-ments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense. Those skilled in that understand the details of a fabrication process for a memory device and thus, for brevity, in the following description, details related to oxide layer deposi-tion, metal layer deposition, photoresist layers, masks, chemical and/or plasma etching, dopant implant techniques and other known details are omitted.

During fabrication of a memory device, a CMP process can be used to planarize a deposited layer prior to depositing the next layer. However, in some cases the CMP process causes one portion of the deposited layer to polish faster than other portions causing erosion. For example, FIG. 1A illus-trates a cross-section of a portion of an intermediate die 10a after several fabrication steps that include metal and/or oxide depositions, masks and/or etches. The intermediate die 10a includes an oxide layer 14 deposited on the silicon substrate 12 and metal layers 22a and 22b formed in the oxide layer 14. As seen in FIG. 1A, after deposition of the latest oxide layer, the top surface of 24 of the intermediate die 10a has imperfections and needs to be planarized using, for example, a CMP process. FIG. 1B illustrates a cross-sectional view of an intermediate die 10b after the CMP process. The dotted line 32 represents a desired surface height after the CMP process. However, due to variations in the CMP process that can cause one portion of the deposited oxide layer 14 to polish faster, portions of the actual surface 34 can erode below the desired surface height 32, which can cause problems in the subsequent fabrication steps. For example, in FIG. 1C, a metal layer 42 is deposited onto the surface 34 to form intermediate die 10c. The intermediate die 10c is subject to additional oxide depositions, masking, etchings, etc. in order to form, for example, metal contacts 44a and 44b in intermediate die 10d. As seen in FIG. 1D, due to the erosion in intermediate die 10b, a layer of metal 46 remains after the etching process and thus could cause this component and/or the memory device to fail.

Figure 2A:
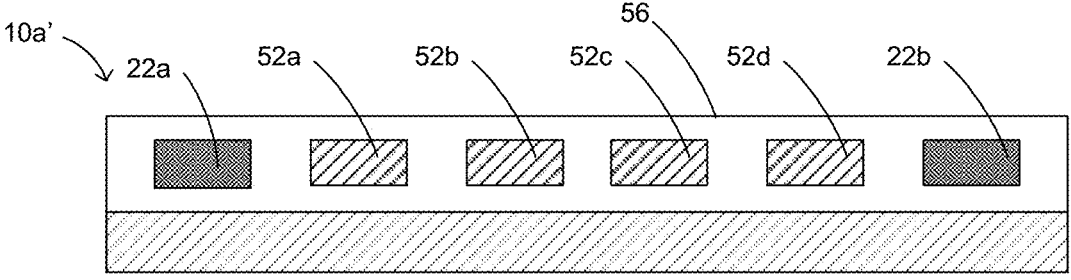
FIGS. 2A to 2C are simplified cross-sectional views of a portion of a memory device during various stages of fabri-cation.
Figure 2B:
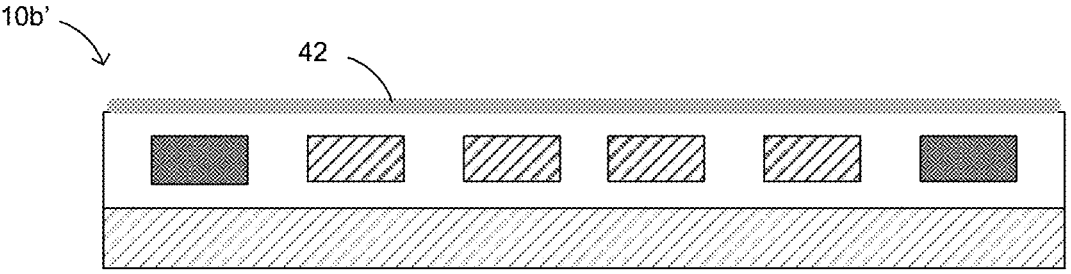
Figure 2C:
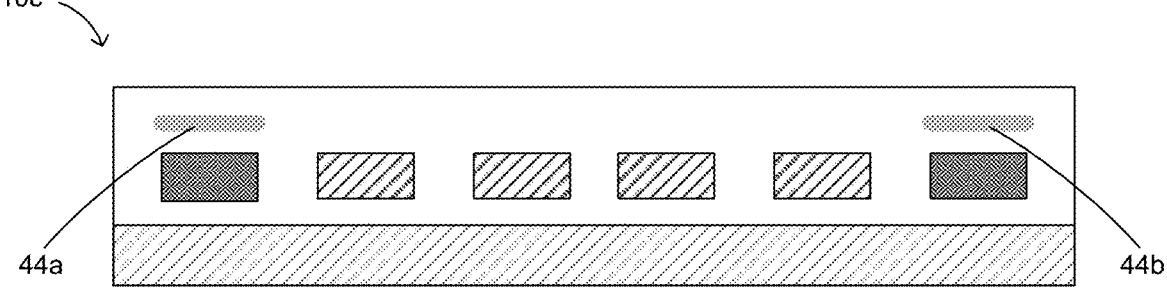

To minimize the erosion (e.g., erosion due to the CMP process), dummy metal fills can be used to improve uniformity in the metal pattern density (also referred to herein as "metal density") in a level of the memory device and/or a portion of the level. As used herein "level" refers to a metallization layer along a vertical position the memory device, where a lower level is closer to the substrate than a higher level. In the following description, level generally refers to a layer of deposited live metal and/or any dummy metal fills and any inter-metal dielectric (e.g., levels W0, W1, and W2 of FIG. 3). A level can be separated and isolated from another level by inter-level dielectric. The dummy metal fills can be deposited to ensure that the live metal portion and the dummy metal fills produce an acceptable metal density to minimize erosion for that level. As seen in FIG. 2A, when dummy metal fills 52*a-d* are added, the added structure produces a metal density for that level that lessens the erosion of the top surface 56 of the intermediate die 10*a*' (e.g., erosion due to a CMP process). With the erosion lessened, the deposition of metal layer 42 in die 10*b*' (see FIG. 2B) and the additional oxide depositions, masking, etchings, etc. in order to form, for example, metal contacts 44*a* and 44*b* in intermediate die 10*c*' (see FIG. 2C) can hopefully occur without failure of the component and/or the memory device.

However, as indicated above, in a conventional process, dummy metal fills are electrically floating. If the charge accumulation gets too high in the floating dummy metal fills, the memory device or a portion of the memory device can fail, due to, for example, a breakdown of the oxide (e.g., gate oxide), inter-level dielectric (ILD), and/or inter-metal dielectric (IMD) and/or some other type of failure related to the accumulated charge in the floating dummy metal fill. Because of this issue, the size of the dummy metal fill is kept below a predetermined value that is based on the breakdown voltage properties of the surrounding oxide, ILD and/or IMD. "Size" used herein refers to the cross-sectional area dimensions as viewed from the top of the memory device (e.g., direction of viewing a top surface of the substrate). In addition, along with ensuring the dummy metal fill size is at or below the predetermined size, the dummy metal fills are placed a minimum distance away from live metal components to minimize adverse effects due to the accumulated charge. Along with the accumulated charge in the dummy metal fill, the minimum distance is also based on the electrical properties of the live metal (e.g., current/voltage in the live metal during operation). In conventional systems, the size and placement (e.g., minimum distance from live metal) of the dummy metal fills is typically determined by dummy fill software tools (e.g., tools developed by Calibre from Siemens, Assura from Cadence, IC Validator from Synopsys, etc.) (also referred to herein as "fill tools"). These fill tools include (and/or otherwise have access to) dummy fill design rules (also referred to herein as "design rules") that attempt to minimize the disruption in the electrical performance of the memory device due to, for example, the antenna effects of the dummy metal fills. In general, the design rules in conventional systems minimize the size of the dummy metal fills and/or maintain a minimum acceptable distance between the dummy metal fill and the surrounding live metal. However, at times, these conventional design rules may not keep the metal density of the level (or a portion of the level) within acceptable limits. Accordingly, in addition to still having some antenna issues, conventional systems can still have erosion issues because the uniformity of the metal density can be improved.

In exemplary embodiments of the present disclosure, the dummy metal fill includes antenna protection that ensures that any accumulated charge during the fabrication process is discharged to an electric drain (e.g., a substrate of the memory device can be an electric drain if connected to ground potential or other appropriate potential). By making sure the charge does not accumulate, the size of the dummy metal fill can be determined based on metal density limits for the level and/or a portion of the level rather than breakdown voltage of the surrounding material. In addition, because the charge does not accumulate, the minimum distance between the dummy metal fill and the surrounding live metal can be based on just the electrical properties of the live metal (e.g., current/voltage in the live metal during operation) and not that of the dummy metal fill. Accordingly, dummy metal fills in embodiments of present disclosure can be made larger and placed closer to live metal than in conventional memory devices. In some embodiments, the dummy metal fill is not directly connected to an active semiconductor device or live metal in the memory device but can have a common connection at an electrical drain (e.g., a substrate that is connected to ground potential or another appropriate potential). In some embodiments, a memory device can include a semiconductor substrate having a plurality of active semiconductor devices. The memory device can include a plurality of metallization layers disposed over the semiconductor substrate, where each of the plurality of metallization layers is separated from adjacent metallization layers by an interlayer dielectric. The memory device also includes a dummy metal fill disposed in a metallization layer. The dummy metal fill can be connected to a discharge path for dissipating a charge build up in the dummy metal fill to minimize antenna effects. In some embodiments, the discharge path can include the semiconductor substrate, which can be connected to an electrical drain. The antenna protected dummy metal fill ensures is configured such that any accumulated charge during the fabrication process is discharged to the electric drain. In some embodiments, a size of the dummy metal fill can be greater than a maximum design size of a floating dummy metal fill for the same memory device.

In another embodiment, a method can include depositing a dummy metal fill in a level of a memory device with the level having one or more semiconductor layers deposited thereon. The method can also include configuring a discharge path for the dummy metal fill for dissipating a charge build up in the dummy metal fill to minimize antenna effects. In still another embodiment, a non-transitory computer-readable storage medium can include instructions that, when executed by a processing device, cause the processing device to identify a candidate fill area in a level of a memory device for deposition of a dummy metal fill. The instructions also cause the processing device to determine whether there is a discharge path for the dummy metal fill and determine a type of the dummy metal fill to generate based on the determined discharge path. The discharge path can dissipate a charge build up in the dummy metal fill to minimize antenna effects.

Figure 3:
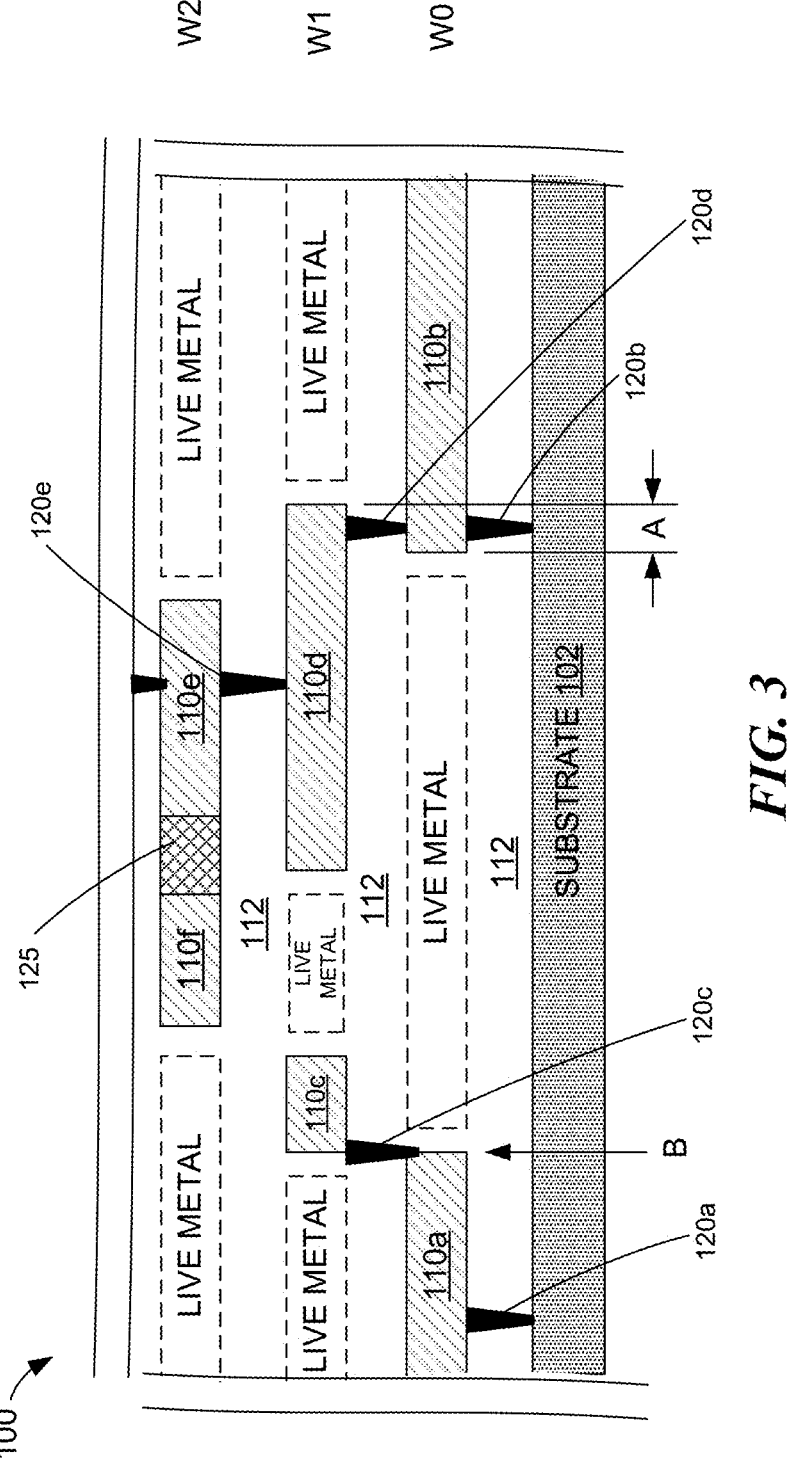
FIG. 3 is a simplified cross-sectional view of a portion of a memory device fabricated in accordance with the present disclosure.

FIG. 3 illustrates a cross-section of a portion of a die 100 in a memory device. As seen in FIG. 3, dummy metal fills 110*a-g* (collectively, 110) are deposited in areas of the memory die 100 that do not have live metal. Each of the dummy metal fills 110 includes a discharge path (e.g., directly or indirectly) to an electrical drain. In the exemplary embodiment of FIG. 3, the electrical drain is substrate 102 that is connected to ground potential or another appropriate potential. However, in other embodiments, the electrical drain can be one or more ground buses and/or one or more other sources (e.g., a negative source or positive source) that equalize any charge difference between the dummy metal fills 110 of the various levels (e.g., W0, W1, W2, etc.) of the memory die 100 and the inter-metal dielectric and/or inter-level dielectric (e.g., oxide 112). That is, unlike the dummy metal fills in conventional memory devices, any charge build-up in the dummy metal fills (e.g., due plasma etching, etc.) does not accumulate. Rather, any charge built-up is dissipated through a discharge path. By ensuring that any charge build-up in the dummy metal fills 110 is eliminated or minimized, the potential for breakdown of oxide (e.g., gate oxide), ILD, and/or IMD is eliminated or minimized.

In the embodiment of FIG. 3, the discharge path for each of the dummy metal fills 110 includes one or more via conductors (also referred to herein as "via" or "vias") that serve as connection lines through, for example, inter-level dielectric, to connect one or more dummy metal fills 110 on different levels and/or between a dummy metal fill 110 and substrate 102. In some embodiments, the vias connect dummy metal fills on adjacent levels, such as, for example, dummy metal fills on W0 and W1, dummy metal fills on W1 and W2, etc. However, in other embodiments, the dummy metal fills need not be on adjacent levels and the vias can connect between any two levels such as, for example, dummy metal fills on W0 and W2. Similarly, the vias can connect between a substrate and dummy metal fills on a level adjacent to the substrate, such as, for example, W0, or the vias can connect the substrate and dummy metal fills on any level, e.g., W0, W1 and W2, etc. In some embodiments, the vias can have a cross-section that is rectangular shaped (e.g., a square) as viewed from the top (see FIG. 4) in which each side has a dimension that is in a range from, for example, 100 nm to 1 micron (e.g., 100 nm to 500 nm). For example, if a square shaped via is formed, the dimension can be 100 nm×100 nm, 500 nm×500 nm, 1 micron×1 micron, or any dimension in between. Of course, in some embodiments, via dimensions can be smaller than 100 nm and/or greater than 1 micron depending on the circuit design. In addition, the vias can have a non-square shape such as, for example, a circular cross-section, a rectangular cross-section, an oblong cross-section in which the dimensions (e.g., a diameter, a length, a width, etc.) of the via is in a range from 100 nm to 1 micron (or smaller than 100 nm or larger than 1 micron, depending on the circuit design). In some embodiments, the memory die 100 can include one or more vias 120a-f (collectively 120) connecting a first dummy metal fill 110 and either the substrate 102 or another dummy metal fill 100 that located on a lower level to the first dummy metal fill 110. For example, dummy metal fills 110a and 110b, which are on the W0 level that is directly above the substrate 102, can include respective vias 120a and 120b that connect the dummy metal fills 110a and 110b to substrate 102. Because each via 120 is composed of a metal (e.g., tungsten, copper, poly Wsix, etc.), the vias 120 can provide an electrical connection between dummy metal fills 110 and/or between a dummy metal fill and the substrate 102. Thus, any charge build-up in the respective dummy metal fills 110a,b will discharge to substrate 102 to ensure that a voltage potential between the dummy metal fill 110a,b and the oxide 112 is kept at or below a minimum breakdown voltage for the oxide 112. Although FIG. 3 shows only one via 120 extending below each dummy metal fill 110a and 110b, in some embodiments, depending on the size of the dummy metal fill, more than one via can be formed.

In some embodiments, the memory die 100 can include one or more vias between a dummy metal fill and a dummy metal fill at a lower level if the lower dummy metal fill has a discharge path to an electrical drain (e.g., the substrate 102). For example, in FIG. 3, the W1 level in memory die

100 includes dummy metal fills 110c and 110d. Each of the dummy metal fills 110c and 110d is connected to a dummy metal fill in the level below using a via 120. For example, dummy metal fills 110c is electrically connected to dummy metal fill 110a using via 120c, and dummy metal fills 110d is electrically connected to dummy metal fill 110a using via 120d. In some embodiments, when viewed from the top, dummy metal fills that are connected between levels using one or more vias can have a minimum overlap of the dummy metal fills to facilitate formation of the one or more vias between the levels. For example, the dummy metal fills 110b and 110d, which are located on different deposition layers (e.g., levels W0 and W1), overlap by a value A when view from the top. "Overlap" as used herein is an overlap in a horizontal position (e.g., on planes parallel to the substrate) as view from the top of the dummy metal fills located on different levels. The overlap value A can represent a minimum overlap that is required before a via (e.g., via 102d) can be formed (e.g., the minimum overlap can be based on fabrication tolerances for the memory device). In some embodiments, the via 102d can be formed in a middle portion of the overlap area so that an entirety of the via cross-section size as viewed from the top is within the overlap area. However, in other embodiments, no overlap is required so long as the via cross-section as viewed form the top is wide enough to connect the dummy metal fills on the different levels. For example, as seen by the arrow B, there is no overlap between dummy metal fill 110a and 110c, which are adjacent to each other when viewed from the top. However, the via 120c can be formed wide enough to connect to both dummy metal fills.

In some embodiments, the memory die 100 can include one or more merge fills that connect dummy metal fills that are on the same level. For example, merge fills can be formed if there is no dummy metal fill at a lower level with a discharge path to an electrical drain (e.g., the substrate 102) for one of the dummy fills but another dummy metal fill on the same level has a discharge path. As seen in FIG. 3, dummy metal fill 110e includes a discharge path to the substrate 102 using via 120e, dummy metal fill 110d, via 120d, dummy metal fill 110b, and via 120b. However, dummy metal fill 110f does not include a discharge path because there is no dummy metal fill that it can connect to at a lower level. In such cases, a merge fill 125 that is electrically conductive can be formed to connect dummy metal fill 110f to dummy metal fill 110e. In some embodiments, the merge fill 125 can be composed of the same material as the dummy metal fills 110. However, in other embodiments, the merge fill 125 can be composed of a different material, for example, based on metal density requirements for the level and/or a portion of the level.

Figure 4:
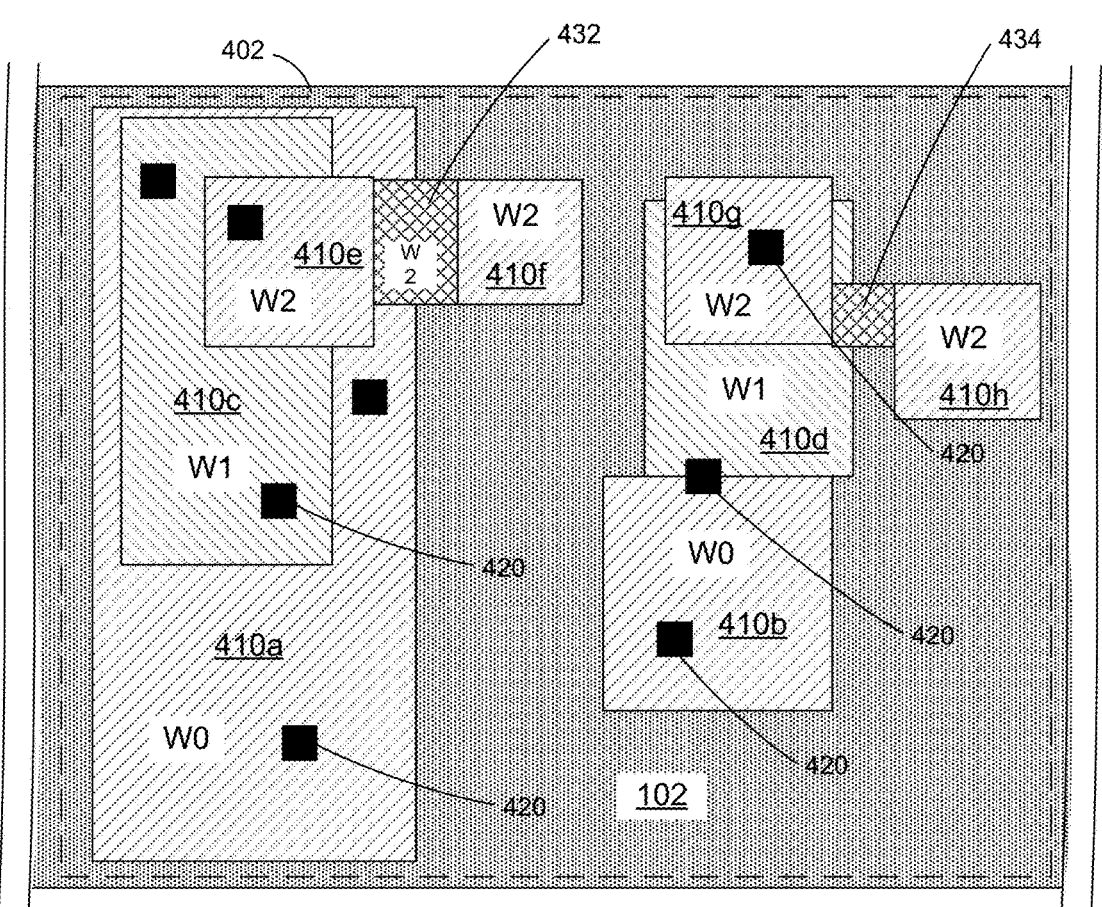
FIG. 4 is a simplified top view of a portion of a memory device fabricated in accordance with the present disclosure.

FIG. 4 illustrates a top view of another portion of a memory die 100. For clarity, the live metal has been removed from the view. The dotted box 402 can represent one "grid" (e.g., a portion of a level) of an arbitrary grid pattern for each level (e.g., levels W0, W1, W2). In this case, for clarity, the grid 402 is the same (e.g., same dimensions and/or same placement on the respective level) for levels W0, W1, and W2. However, in other embodiments, the grids on each level can be different (e.g., different dimensions and/or different placement on the respective level). The memory die 100 can be configured such that one or more grids and/or one or more levels have similar metal density between the live metal portions and dummy metal fills, if possible. That is, the metal structures, whether live metal or dummy metal fills, form a uniform (or approximately uniform) metal density across the grid and/or level. In some embodiments, the antenna protected dummy metals fills and thus the metal density of the grid and/or level can be maximized. For example, the size and/or number of dummy metal fills for a given grid and/or level can be increased until design limits (e.g., breakdown voltage limits, etc.) are reached. As indicated above, the addition of dummy metal fills will minimize erosion caused by, for example, the CMP process. In the embodiment of FIG. 4, grid 402 of level W0 includes two dummy metal fills 410a and 410b. Each of the dummy metal fills 410a and 410b include one or more vias 420 that electrically connect the respective dummy metal fill to substrate 102 to provide an electrical discharge path. In the case of dummy metal fill 410a, there are two vias 420. The dummy metal fills 410a and 410b are sized such that, when combined with the live metal (not shown) in grid 402 for level W0, the grid 402 of level W0 has an acceptable metal density (e.g., a similar metal density and/or a maximum metal density across the grid and/or level). Each of the other grids for level W0 can similarly include, if needed, dummy metal fills (and/or merge fills) of a sufficient number and size to ensure that the respective grids have an acceptable metal density. In some embodiments, by ensuring each grid of level W0 has an acceptable metal density, the CMP process on level W0 can be performed with minimal erosion.

The grid 402 for level W1 includes two dummy metal fills 410c and 410d. Because dummy metal fills 410a and 410b, which have discharge paths to an electrical drain (e.g., substrate 102), are located below the respective dummy metal fills 410c and 410d, vias 120 are formed to electrically connect the respective pairs of dummy metal fills. In the case of dummy metal fills 410a and 410c, there is an overlap so that a width or diameter (collectively "width") of the via is not relied upon for making a connection. In this case, two vias 420 are formed to electrically connect dummy metal fills 410a and 410c. However, in the case of dummy metal fills 410b and 410d, there is no overlap and the width of a via 420 is relied upon to make the connection. Similar to level W0, the dummy metal fills 410c and 410d of level W1 are sized such that, when combined with the live metal (not shown) in grid 402 for level W1, the grid 402 of level W1 has an acceptable metal density (e.g., a similar metal density and/or a maximum metal density across the grid and/or level). Each of the other grids for level W1 can similarly include, if needed, dummy metal fills (and/or merge fills) of a sufficient number and size to ensure that the respective grids have an acceptable metal density. In some embodiments, by ensuring each grid of level W1 has a uniform metal density, the CMP process on level W1 can be performed with minimal erosion.

The grid 402 for level W2 includes four dummy metal fills 410e, 410f, 410g, and 410h. Because dummy metal fills 410c and 410d, which have discharge paths to an electrical drain using dummy metal fills 410c and 410d, are located below the respective dummy metal fills 410e and 410g, vias 120 are formed to electrically connect the respective pairs of dummy metal fills. However, dummy metal fills 410f and 410h do not have any available discharge paths using vias. In this case, merge fill 432 can be deposited on level W2 to electrically connect dummy metal fill 410f to dummy metal fill 410e, which has a discharge path to an electrical drain. Similarly, merge fill 434 can be deposited on level W2 to electrically connect dummy metal fill 410f to dummy metal fill 410e, which has a discharge path to an electrical drain. Similar to levels W0 and W1, the dummy metal fills 410e-h of level W2 and/or merge fills 432 and 434 can be sized such that, when combined with the live metal (not shown) in grid 402 for level W2, the grid 402 of level W2 has an acceptable metal density (e.g., a similar metal density and/or a maximum metal density across the grid and/or level). Each of the other grids for level W2 can similarly include, if needed, dummy metal fills (and/or merge fills) of a sufficient number and size to ensure that the respective grids have an acceptable metal density. In some embodiments, by ensuring each grid of level W2 has an acceptable metal density, the CMP process on level W2 can be performed with minimal erosion.

Figure 5:
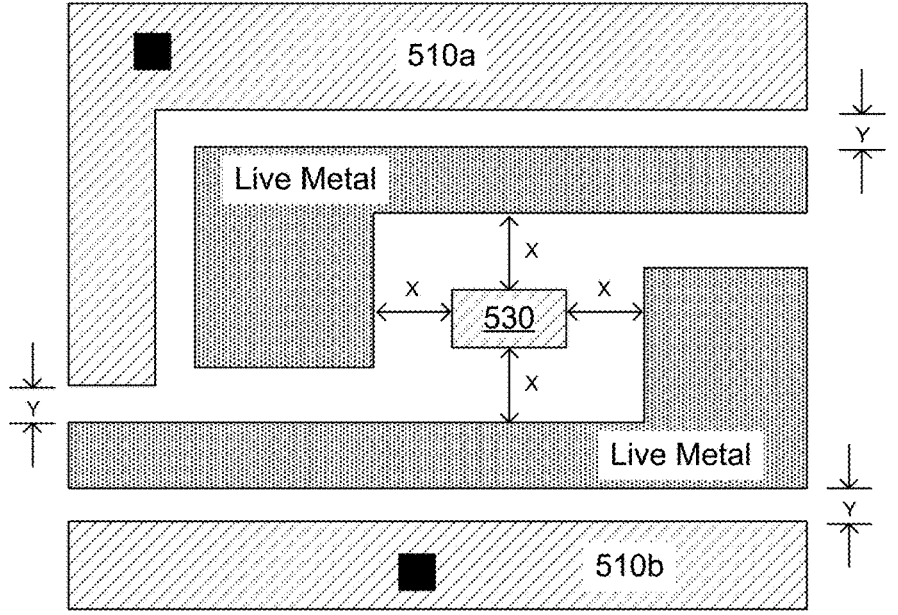
FIG. 5 is a simplified top view of a portion of a memory device fabricated in accordance with the present disclosure.

In some embodiments, to minimize antenna effects, floating dummy metal fills can be prohibited from being deposited in a memory device. However, there can be cases where it is not possible to connect a dummy metal fill to an electrical drain, but the dummy metal fill is still needed because of erosion or other problems, as discussed above. Accordingly, in some embodiments, the memory die 100 can include floating dummy metal fills. For example, as seen in FIG. 5, a grid section includes dummy metal fills 510a and 510b that are connected to an electrical drain using vias. However, dummy metal fill 530 cannot be not connected to a discharge path. Accordingly, dummy metal fill 530 is created as a floating dummy metal fill. Because dummy metal fill 530 is floating, its size must be limited to prevent an excess charge accumulation that can cause breakdown of the oxide, ILD and/or IMD. In addition, the dummy metal fill 530 must be located a predetermined minimum distance X from the live metal, which must take into account the accumulated charge of the floating dummy metal fill 530 and operating voltage/current of the live metal. In contrast, because there is no charge build-up in dummy metal fills 510a and 510b, the dummy metal fills 510a and 510b can be larger and located closer to the live metal by a predetermined distance Y, which can be equal to or smaller than X taking into account the operating voltage/current of the live metal.

Figure 6:
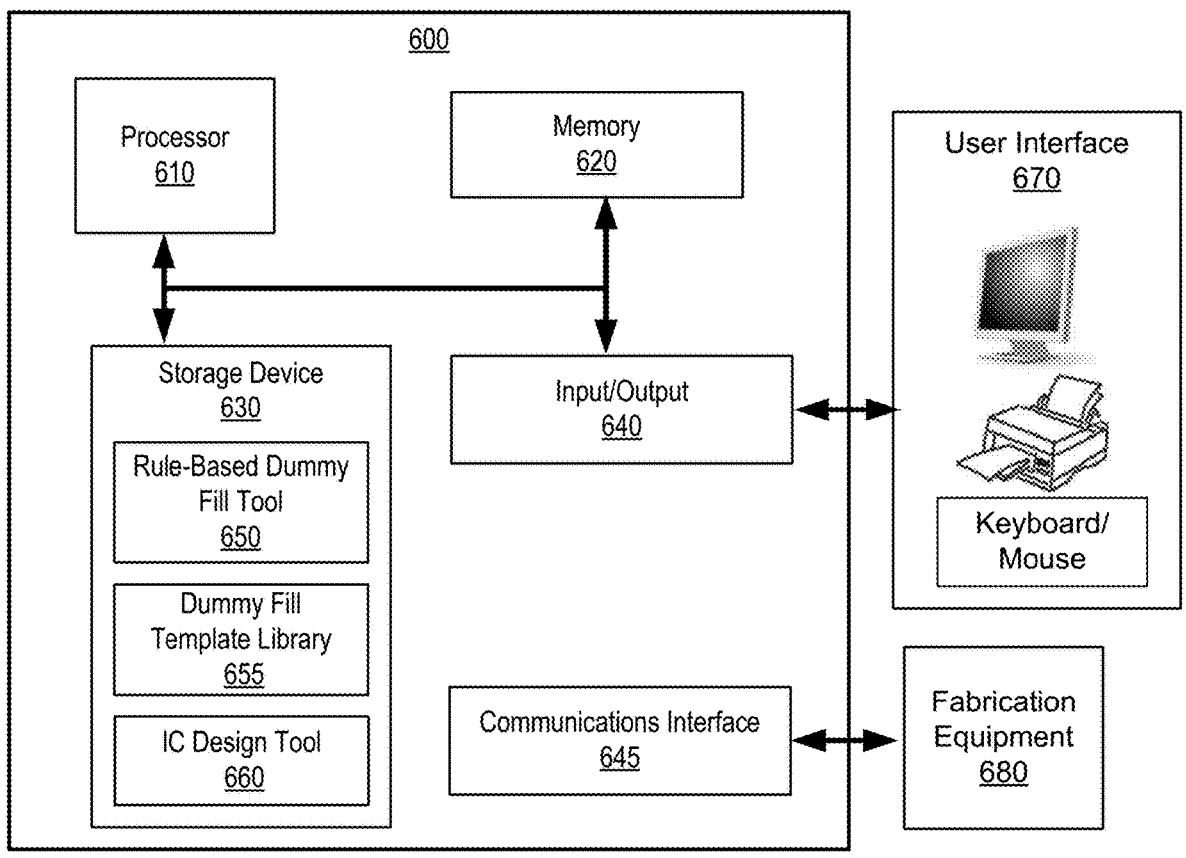
FIG. 6 shows a computer system in accordance with the present disclosure.

Some of the embodiments described herein are described in the general context of methods or processes for designing the circuit layout of memory devices, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read-Only Memory (ROM), Random Access Memory (RAM), compact discs (CDs), digital versatile discs (DVD), etc. Therefore, the computer-readable media may include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes. For example, FIG. 6 discloses a computer system 600, with storage device 630 including an IC design tool 660 that can be used to design a logic layout onto a silicon wafer. Such IC design tool software programs are known in the art and thus, for brevity, will not be further discussed. The storage device 630 also includes a rule-based dummy fill tool 650 that adds dummy fills to the logic layout generated by the IC design tool 660. In some embodiment, rule-based dummy fill tool 650 identifies candidate fill areas within the logic layout that need dummy fills (e.g., dummy metal fills) based on predetermined design rules. In some embodiments, the rule-based dummy fill tool 650 can generate dummy fills to add to the identified candidate fill areas in the logic layout to create a circuit layout for fabrication. In some embodiment, the identification of candidate fill areas and/or generation of dummy fills based on the candidate fill areas can be done automatically by the rule-based dummy fill tool 650 based on dummy fill design rules, discussed below. The instructions in programs 650 and 660 can be executed by a processor 610 using memory 620. In some embodiments, a user can input one or more design rules before and/or during processing such as, for example, allowing or prohibiting floating dummy metal fills, and/or allowing or prohibiting certain template shapes/sizes, etc. For example, a user can operate the computer system 600 via a user interface 670 (e.g., monitor, keyboard, mouse, printer, etc.) connected to input/output interface 640 in computer system 600. In some embodiments, the computer system 600 can include a communications interface 645 that connects (e.g., via a wired and/or wireless network connection such as a LAN, WAN, Internet, etc.) the computer system 600 to a fabrication equipment 680 that can fabricate the IC chip based on the circuit layout from tools 650 and 660.

Figure 7:
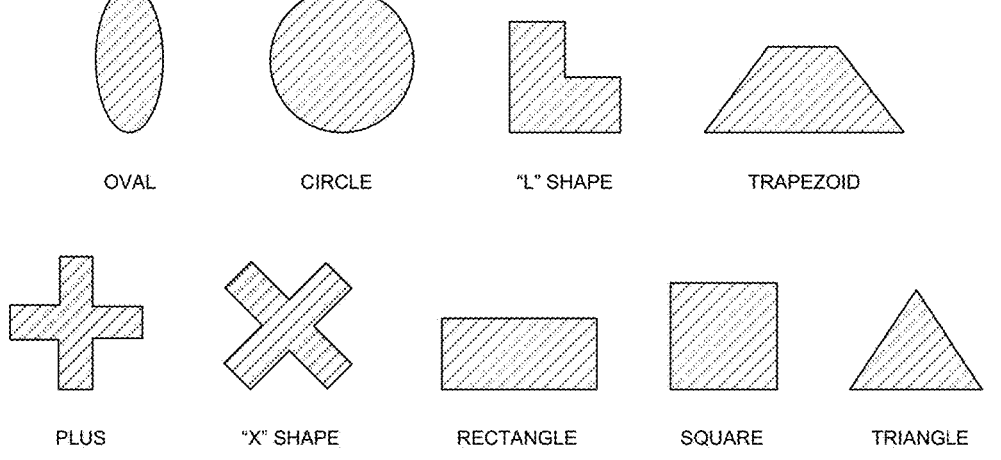
FIG. 7 shows template shapes for dummy metal fills in accordance with the present disclosure.

In some embodiments, the storage device 630 can include a dummy fill template library 655 that can be used by the rule-based dummy fill tool 650. The dummy fill template library 655 can include, for example, one or more shapes and/or sizes for dummy fills that the rule-based dummy fill tool 650 can access when generating a dummy fill. For example, in some embodiments, the rule-based dummy fill tool 650 can be configured to use standard and/or user-customized predetermined shapes and sizes (collectively referred to herein as "template shapes and sizes") for the dummy metal fills. In some embodiments, the template shape can be any type of polygonal shape having any number of sides (or edges) that are curved and/or straight and/or any type of non-polygon shape. In some embodiments, an upper limit on the sides/edges for the polygonal shape can be being based on manufacturing tolerances. In some embodiments, one or more polygonal shapes and/or one or more non-polygon shapes can be combined to form a template shape for the dummy metal fill. FIG. 7 illustrates some exemplary template shapes such an oval, a circle, an "L" shaped polygon, a trapezoid, a plus shaped polygon, an "X" shaped polygon, a rectangle, a square, and a triangle. However, exemplary embodiments are not limited to these shapes and the template shape pattern can be any random shape having any number of sides/edges. The template shapes that can be included in the dummy fill template library 655. Each of the template shapes can include one or more predetermined sizes so that, along with selecting a template shape, the rule-based dummy fill tool 650 can also select a template size based on the candidate fill area. Alternatively, or in addition to the dummy fill template library 655, the rule-based dummy fill tool 650 can custom generate a dummy fill design for the candidate fill area. Such an embodiment provides a maximum flexibility in designing the dummy metal fills for each level of a memory die. However, because such custom designs can be resource intensive with respect to processing time and/or memory, in some embodiments, use of template shapes and sizes for dummy fills is given priority over use of custom generated shapes and sizes for dummy fills.

In some embodiments, the rule-based dummy fill tool 650 (or another software program) identifies (e.g., automatically) candidate fill areas and/or generates (e.g., automatically) dummy fill (e.g., dummy metal fills) based on design rules. The design rules for identifying candidate fill areas include finding areas on each level of a memory die (e.g., W0 level, W1 level, etc.) that do not include live metal (e.g., logic circuits, memory cells, corresponding metal connections and traces, etc.) and then designating these non-live metal areas as potential candidates for dummy metal fills. For example, candidate fill areas for a level can be areas on the level that only include an oxide deposition. The specific details on how dummy fill areas are identified are known to those skilled in the art and thus, for brevity, are omitted herein. In addition to including rules for identifying candidate fill areas, the rules can include design rules for generating dummy metal fill designs. As indicated above, in conventional systems, design rules for dummy metal fills are directed to floating dummy metal fills. In exemplary embodiments of the present disclosure, however, the design rules are directed to antenna protected dummy metal fills, such as design rules for dummy metal fills connected to a discharge path using a via connection and/or a merge fill.

In some embodiments, based on the design rules, the rule-based dummy fill tool 650 (or another software program) can determine whether a candidate fill area and/or a portion of a candidate fill area can include a dummy metal fill connected to a via for its discharge path (referred to herein as a "via dummy metal fill") and/or a dummy metal fill connected to a merge fill for its discharge path (referred to herein as a "merge dummy metal fill") and/or a floating dummy metal fill. For example, the design rules can include a rule that a via dummy metal fill can be located in candidate fill area if there is a discharge path located in a level below the candidate fill area. In addition, the design rules can include a rule that a merge dummy metal fill can be located in a candidate fill area, if the candidate fill area has another dummy metal fill that is connected to a discharge path (e.g., a discharge path based on a via dummy metal fill and/or a merge dummy metal fill). In some embodiments, the rule-based dummy fill tool 650 (or another software program) can segment each level into grids in order to facilitate identification of candidate fill areas and determine whether there is an acceptable metal density for the grid and/or level. In other embodiments, one or more (or all) of the levels are not segmented into grids and the analysis can be performed on a level-by-level basis. In some embodiments, a merge fill is limited to the candidate fill area (e.g., limited to a grid area) and in other embodiments, a merge fill can extend between candidate fill areas (e.g., extend between one or more grids). The design rules can also include a rule that, if neither a merge dummy metal fill nor a via dummy metal fill is possible in a candidate fill area, a floating dummy metal fill can be located in the candidate fill area using conventional design rules.

In some embodiments, generating at least one via dummy metal fill in a candidate fill area and/or a level takes priority over generating other types of dummy metal fills. That is, at least one via dummy metal fill must exist in a candidate fill area and/or a level. In some embodiments, once at least one via dummy metal fill exists in a candidate fill area and/or a level, additional via dummy metal fills are prioritized over merge dummy metal fills. That is, if possible, via dummy metal fills are generated before other types of dummy metal fills. However, in other embodiments, once at least one via dummy metal fill exists in a candidate fill area and/or a level, merge dummy metal fills are prioritized over via dummy metal fills. In some embodiments, when both are possible, a determination as to whether to generate a via dummy metal fill or a merge dummy metal fill can be based on predetermined criteria such as for example, metal density limits for the grid and/or the level, the size of the candidate area, etc. In some embodiments, the design rules can require a minimum overlap of upper and lower dummy metal fills when viewed from the top in order to configure the upper dummy metal fill as a via dummy metal fill. In some embodiments, the design rules can require that adjacent (non-overlap) upper and lower dummy metal fills when viewed from the top are within a width of a via before the upper dummy metal fill is configured as a via dummy metal fill. In some embodiments, priority rules for which type of dummy metal fill to generate can change on a grid-by-grid basis and/or on a level-by-level basis. For example, on the first level above the substrate (e.g., level W0), generating via dummy metal fills can be the highest priority. However, on other levels, generating merge dummy metal fills can take priority over a via dummy metal fill if both options are available, or vice versa.

In some embodiments, as the dummy metal fills are generated, the rule-based dummy fill tool 650 (or another software program) can keep track of the type of dummy fill that was generated for that grid and/or level. The rule-based dummy fill tool 650 (or another software program) can use the tracked information to check whether a dummy metal fill on the lower level has a discharge path to an electrical drain or is floating when determining whether to generate a via or merge dummy metal fill. In some embodiments, the information is tracked for multiple levels so that via connectors that extend more than one level to connect two dummy metal fills. However, in other embodiments, to save on computer processing resources or for some other reason, the via connectors can be limited to connect dummy metal fills on adjacent levels. In some embodiments, for example in cases where floating dummy metal fills are not permitted, the software can presume that a lower dummy metal fill already includes a discharge path (e.g., a path to ground). In some embodiments, via dummy metal fills that are based on an overlap that is equal to or greater than a minimum predetermined value can be prioritized over ones that are based on an overlap that is less than the minimum predetermined value and/or based on being within a width of the via for connection. Similarly, via dummy metal fills that are based on an overlap that is less than a minimum predetermined value can be prioritized over ones that are based on being within a width of the via for connection. In some embodiments, a dummy metal fill that can be connected to an electrical drain is prioritized over a floating dummy metal fill, and in other embodiments, a floating dummy metal fill is not permitted.

FIG. 8A illustrates a simplified flow chart 800 of a fill tool that can implement an automated rule-based dummy metal fill in accordance with an embodiment of the present disclosure. In some embodiments, computer system 600, with processor 610, can implement the instructions of the flow chart 800. In block 810, an IC layout is loaded into the fill tool. In some embodiments, either prior to or after the loading, the logic layout can be divided into one or more levels so that an analysis can be performed on a level-by-level basis (e.g., W0, W1, W2, etc.). In some embodiments, each level can be divided into one or more grids so that the analysis can be performed on a grid-by-grid basis. In block 820, the next level (e.g., W0, W1, W2, etc.) is loaded into memory for analysis. If it is the first time that step 820 is being performed, the next level can be the first level above the substrate. If the level is divided into a plurality of grids, in block 830, the next grid is loaded into memory for analysis. If the level being analyzed has just been loaded, the next grid can be an arbitrary grid that has been designated as the starting point.

Figure 9A:
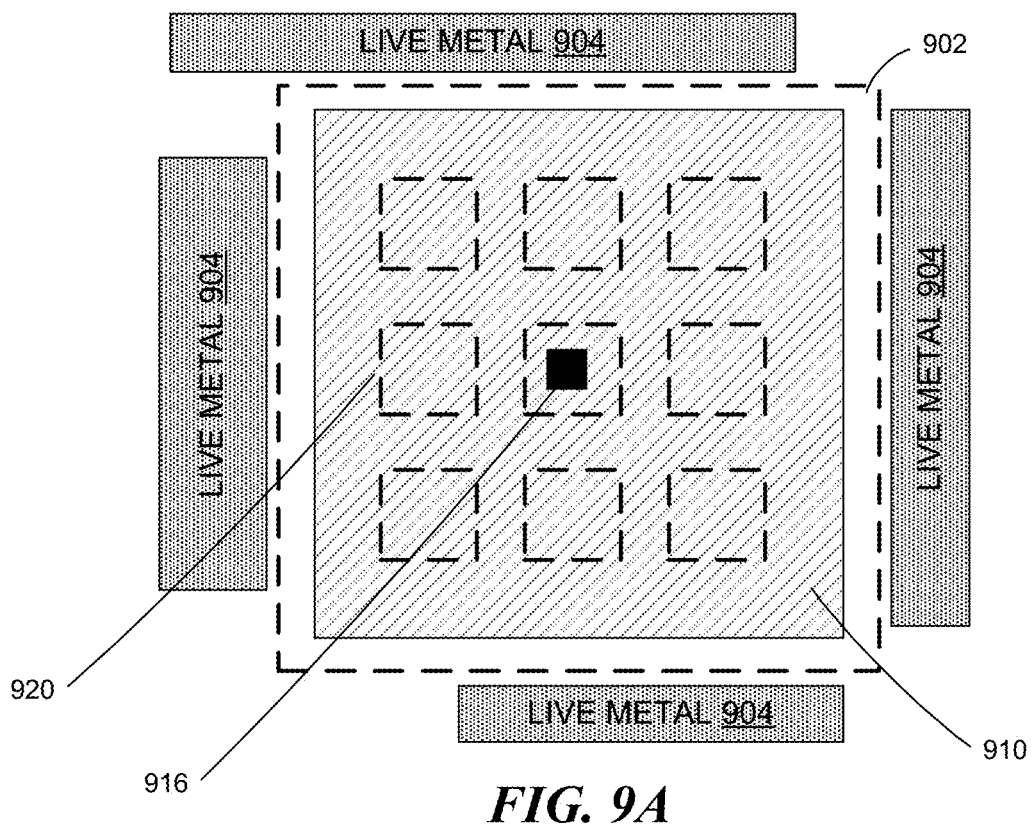
FIGS. 9A and 9B are simplified top views of a grid with a dummy metal fill in accordance with the present disclo-sure.

In block 840, the loaded grid is analyzed and one or more areas corresponding to live metal are located and one or more areas corresponding to candidate fill areas are identified based on surrounding live metal. For example, areas that only have an oxide layer can be a potential candidate for a dummy metal fill. FIG. 9A illustrates an exemplary grid with live metal areas 904 and a candidate fill area 902 that have been identified, for example, in block 840. Algorithms to identify live metal in a grid area and to designate candidate fill areas based on the surrounding live metal areas are known in the art and thus, for brevity, are not further discussed. In block 850, once one or more candidate fill areas are identified, the shape and/or size and/or type of one or more dummy fills (e.g., dummy metal fills) can be determined based at least in part on the predetermined design rules of block 855.

Figure 8B:
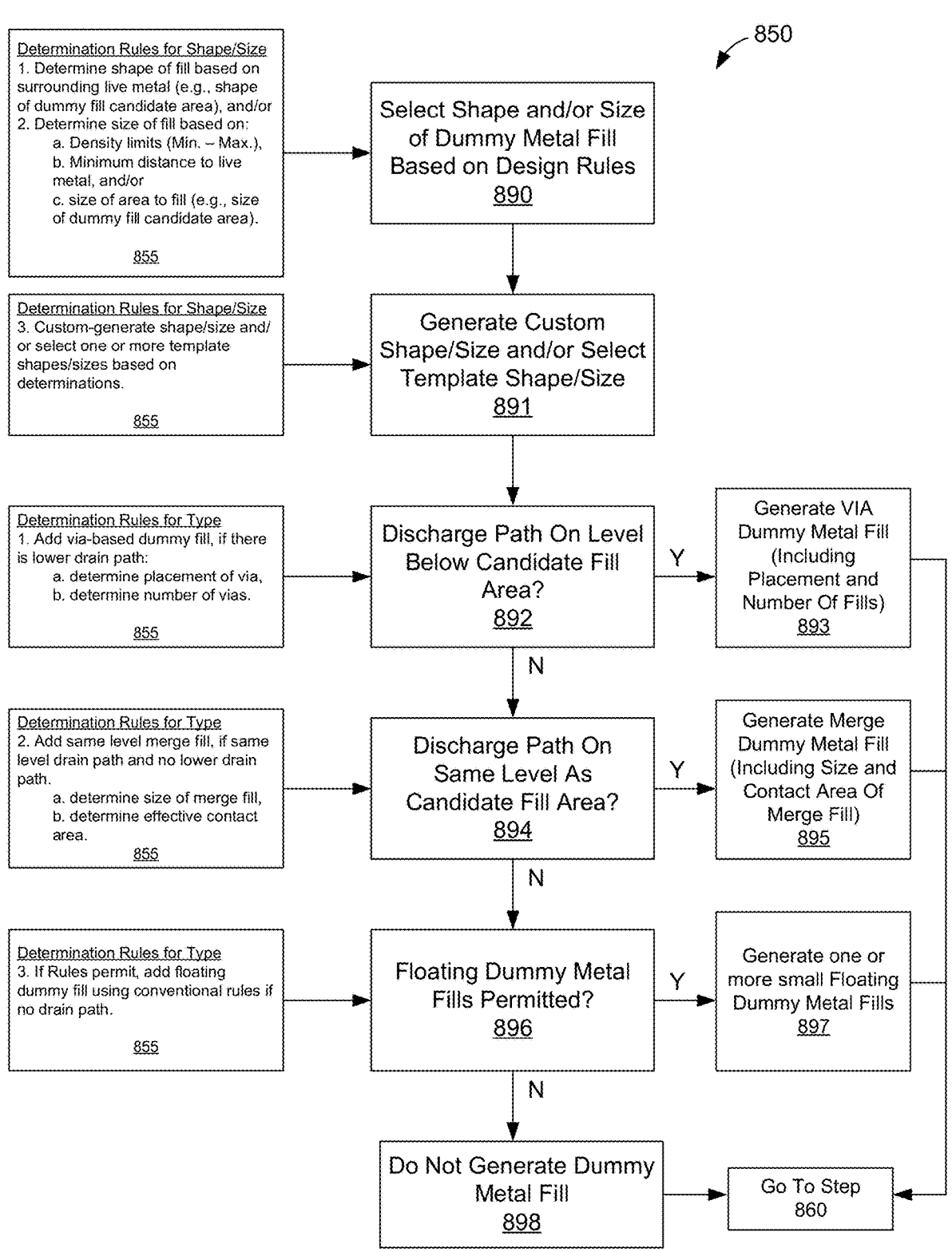
FIG. 8B shows a flow chart that details sub-steps for the determining a type of dummy metal fill step of FIG. 8A.

As seen in block 855, the design rules can include rules for determining the shape and/or size of dummy fills to select and/or rules for determining the type (e.g., via, merge, or floating) of the dummy fill to use. FIG. 8B illustrates sub-steps for the function step in block 850. In block 890, the shape and/or size of the dummy metal fill is selected based on the design rules. In some embodiments, the shape of the dummy metal fill can be based on the shape of identified candidate fill area. For example, in FIG. 9A, the candidate fill area 902 is generally shaped like a square. Thus, based on design rules (e.g., rules in block 855), a determination can be made that a generally square-shaped dummy metal fill (e.g., dummy metal fill 910) should be used. Once the shape (or approximate shape) is determined, in some embodiments, a determination of the size (dimensions) of the selected shape (as viewed from the top) can be made based on design rules (e.g., based on metal density limits/requirements for the grid and/or level, the minimum required distance to the live metal, and/or the physical dimensions of the area to fill, etc.).

Based on the determined shape and/or size, as shown in block 891, the shape and/or size of the dummy metal fill can be custom generated and/or selected from one or more template shapes and/or sizes. For example, in some embodiments, one or more (or all) of the dummy metal fills can be custom generated dummy metal fills. That is, each a dummy metal fill shape and/or size is custom generated to match the specific shape and/or size of the identified candidate fill area. For example, dummy metal fill 910 can represent a custom generated shape with precise dimensions for the area being filled while taking into account design criteria such as, for example, minimum and maximum metal density limits for the grid and/or level, minimum distance to the live metal, etc. Alternatively, or in addition to custom generates shapes/sizes, in some embodiments, the generation of one or more (or all) of the dummy metal fills can be based on selecting one or more template shapes and/or selecting one or more template sizes for each shape (e.g., a template shape). The selection of the template shape and/or size can be based on the shape and/or size of the candidate fill area. The template shapes and sizes can be stored in a database structure. In some embodiments, a template library such as, for example, template library 655 or another library can include some or all available standardized and/or user-customized predetermined shapes and/or sizes. Based on the shape and/or size of the candidate fill area, a template shape and/or size can be selected that most closely matches the candidate fill area. For example, turning to FIG. 9A, instead of being a custom generated dummy metal fill, the dummy metal fill 910 can be based on a square template and/or the size of the dummy metal fill 910 can be based on a template size. As used herein, "match" and "matches" can mean an exact match (within manufacturing tolerances) and/or a closest approximate match based on available template shapes/sizes and/or a closest approximate match based on physical and/or electrical limits of the surrounding material (e.g., metal density limits, breakdown voltage of the material, resistance and/or capacitance characteristics of the material, etc.). By using template shapes and/or sizes, a hierarchical approach can be used in which similarly shaped and/or sized dummy fill objects can be grouped to limit the final circuit layout file size.

Figure 9B:
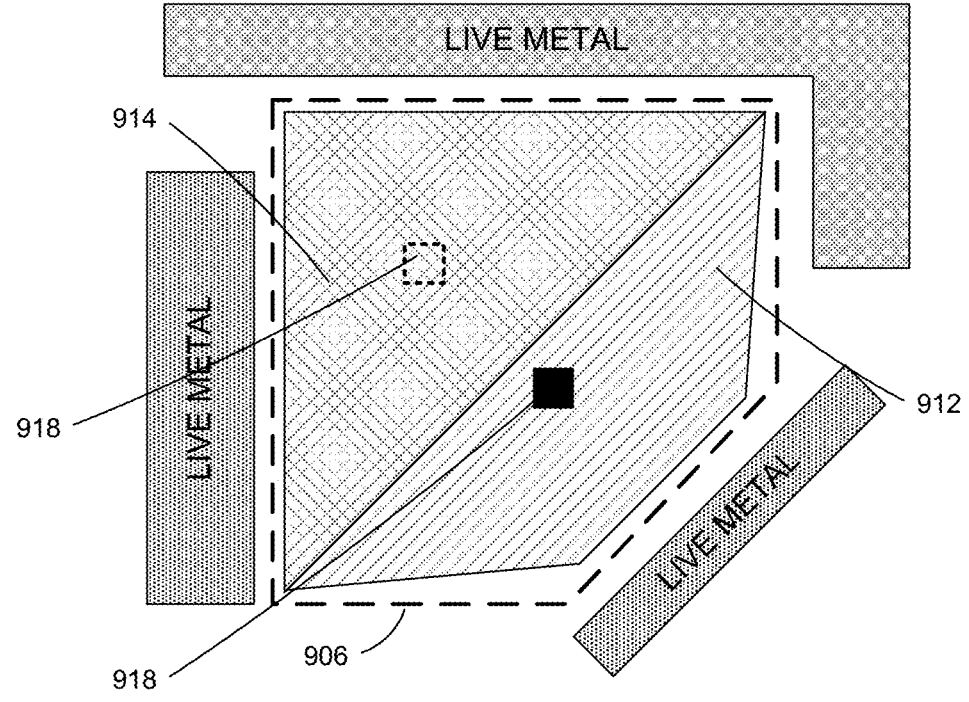

In some situations, the shape and/or size of the candidate fill area may not allow for an acceptable match using just a single template shape and/or size. Thus, in some embodiments, two or more template shapes and/or sizes can be merged to create additional shapes. For example, as seen in FIG. 9B, the shape of the candidate fill area 906 may not match any of the template shapes. In this example, a trapezoidal shape 912 with the appropriate size and a triangle shape 914 with the appropriate size are selected and arranged to match the candidate fill area 906. In some embodiments, the selection and/or placement can be automatic without the need for user input.

Once the shape and/or size of the dummy metal fill is determined, the type of dummy metal fill to use can be determined using the design rules in block 855. For clarity, the following discussion is based on design rules using a dummy metal fill type priority order of 1) via dummy metal fill, 2) merge dummy metal fill, and 3) floating dummy metal fill. However, other variations of the priority order can be used, as discussed above. In block 892, after a shape and size for a dummy metal fill has been determined for a candidate fill area, a check is performed to see whether there is a discharge path to an electrical drain below the candidate fill area. If yes, then in block 893, a via dummy metal fill type is generated based on the determined shape and/or size. For example, using the embodiment of FIG. 3 for discussion purposes, if the substrate 102 is on the level below the candidate fill area, the dummy metal fill on level W0 is configured as a via dummy metal fill (e.g., dummy metal fills 110a,110b with respective vias 120a, 120b). For other levels, a via dummy metal fill type is selected when there are dummy metal fill having a discharge path on the level below (or another discharge path on the level below). For example, via dummy metal fill types are selected for dummy metal fills 110c, 110d, and 110e because each is over a dummy metal fill that has discharge path on the level below. If a via dummy metal fill type is selected, the via can be placed in the via dummy metal fill as discussed above. For example, in the case of level W0, the entirety of the dummy metal fill can be used to locate the via(s) as there is complete overlap with the substrate 102 below. In other levels, the placement can be within an overlap portion with the lower level dummy metal fill or within a width of a via if no overlap. In some embodiments, the via dummy metal fill can include one or more vias based on the electrical properties such as, for example, resistance, capacitance, etc. After generating the via dummy metal fill in block 893, in some embodiments, the process goes to block 860 in FIG. 8.

If, in block 892, a determination is made that the dummy metal fill cannot be configured as a via dummy metal fill type, then in block 894, a check is performed to see to whether the dummy metal fill can be merged to a dummy metal fill on the same level that includes a path to drain (e.g., a via dummy metal fill and/or another merge dummy metal fill). If a merge fill is possible, then in block 895, a merge dummy metal fill is generated based on the design rules. For example, dummy metal fill 110f does not have dummy metal fill on the level below. However, dummy metal fill 110e, which is on the same level W2 as dummy metal fill 110f, includes a path to drain using via 120e and dummy metal fill 110d. Accordingly, based on the design rules, merge fill 125 is deposited to electrically connect dummy metal fill 110f to dummy metal fill 110e. If a merge dummy metal fill is generated, the design rules can be further set to determine dimensions of the merge fill (e.g., merge fill 125) that is used to connect the two dummy metal fills. The merge fill dimensions and/or an effective contact area between the dummy metal fills can be based on properties such as, for example, metal density limits for the grid and/or level and/or electrical properties of the surrounding material. In some embodiments, the determined dimensions for the merge fill (e.g., merge fill 125) can correspond to a maximum effective contact area between the respective dummy metal fills (e.g., dummy metal fill 110f and dummy metal fill 110e). For example, the merge fill can be configured to provide as little resistance as possible between the dummy metal fills. In other embodiments, the determined dimensions for the merge fill can correspond to a minimum effective contact area between the respective dummy metal fills. For example, the merge fill can be configured to use as little material as possible (e.g., to keep within metal density limits) when connecting the dummy metal fills. "Effective contact area" as used herein is an electrically conductive area between the dummy metal fills. After generating the merge dummy metal fill in block 895, in some embodiments, the process goes to block 860 in FIG. 8.

In some exemplary embodiments, if neither a via dummy metal fill nor a merge dummy metal fill can be configured for the candidate fill area, in block 896, a check is performed to see if design rules permit floating dummy metal fills. If yes, then in block 897, one or more small floating dummy metal fills can be generated based on, for example, conventional design rules. For example, if the dummy metal fill 910 in FIG. 9A was not possible because there is no discharge path, the design rules in some embodiments can allow the formation of one or more small floating dummy metal fills 920 shown as dotted boxes. In such cases, the conventional design rules with respect to the maximum size of the dummy metal fill and minimum separation from adjacent fills and live metal can apply in order to account for the accumulated charge. In addition, because their size must be kept small, use of the floating dummy metal fills can mean that achieving a desired density for the grid and/or level may not be possible. For example, as seen in FIG. 9A, the area of the dummy metal fills 920 (dotted boxes) is much less than the area of dummy metal fill 910, which can represent a desired density for the grid and/or level, the dummy metal. Accordingly, in some embodiments, the design rules are set to use floating fill types only after a determination that via dummy metal fill types and merge dummy metal fill types are not possible. After generating the floating dummy metal fill in block 897, in some embodiments, the process goes to block 860 in FIG. 8. In some embodiments, the design rules are set such that floating metal fills are not an option. Thus, the check in block 896 will be a no. If no, then in block 898 no dummy metal fill is generated for the candidate fill and the process goes to block 860 in FIG. 8.

In some embodiments, prior to going to block 860, a check of metal density limits and/or electrical property limits and/or other design checks can be performed for the generated dummy fill shapes, sizes, and types, and based on the checks, an iterative approach can be used to re-perform one or more blocks 890 to 898 to ensure the final generated dummy fill shapes, sizes, and/or types meet design limits for the grid and/or level. The above embodiment of a design rule implementation for the selection of shape and/or size and/or type of dummy fill for a candidate fill area is not limiting and the design rules can be implemented in a different order and/or using different design rule priorities.

In block 860, a check is made to determine if all grids on the current level have been analyzed. If not, the function step goes back to block 830 and the next grid is load and analyzed as discussed above. Once all the grids for the present level have been analyzed, the function step goes to block 870. In block 870, a check is made to determine if all levels on the memory die have been analyzed. If not, the function step goes back to block 820 and the next level is loaded and analyzed. Once all the levels for the memory die have been analyzed, the function step goes to block 880 where the circuit layout file for fabricating the memory die is created based on the logic layout and the dummy fill layout. In some embodiments, the analysis can be performed on a level-by-level basis instead of the analysis being segmented into grids.

Figure 10A:
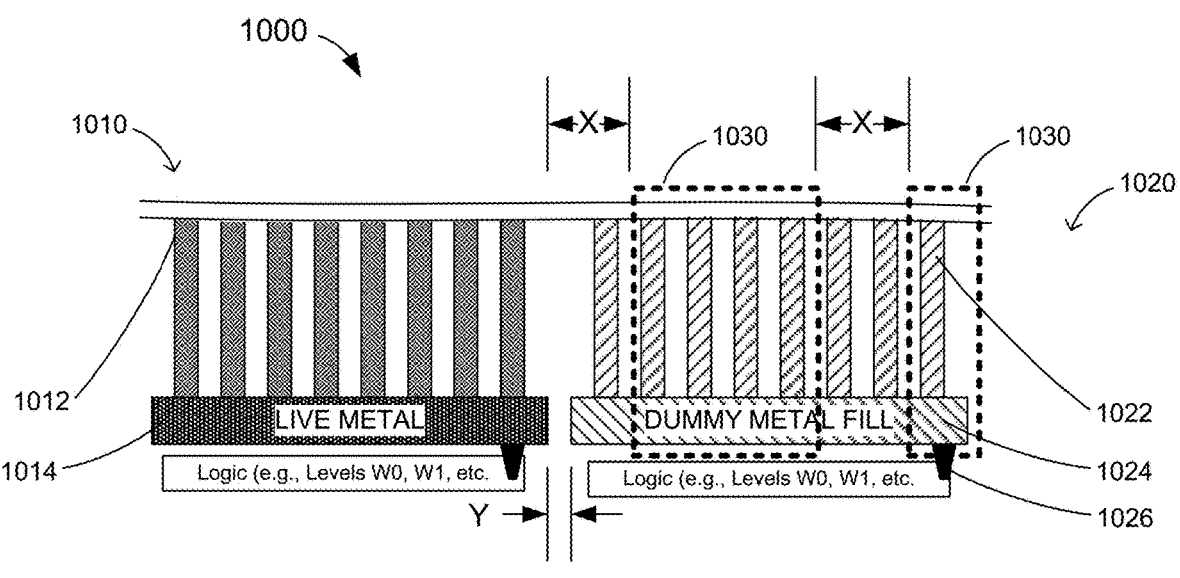
FIGS. 10A and 10B are simplified cross-sectional and top views, respectively, of a 3-D memory array structure includ-ing memory array columns and dummy columns in accor-dance with the present disclosure.

In some exemplary embodiments, the dummy metal fills can be part of a memory array section of the memory die 100. As seen in FIG. 10A, the 3-D memory array section 1000 includes a memory cell array section 1010 and a dummy array section 1020. The memory cell array section 1010 includes a plurality of pillars 1012, with each pillar 1012 corresponding to, for example, a NAND memory cell string. The pillars 1012 are supported by a metal fill 1014 that can be disposed on top of logic for the memory device (e.g., control logic on lower levels W0, W1, etc.). The metal fill can be connected to a voltage source for the 3-D memory cell array. Because the metal fill 1014 is connected to a voltage source, it is live metal and thus not subject to antenna effects. Such 3-D memory cell array sections are known in the art and thus, for brevity are not discussed further.

Similar to the dummy metal fills discussed above, the dummy array section 1020 can be formed to structurally stabilize the 3-D memory array section 1000 to provide an acceptable metal density, which in some embodiments can be a maximum density for the grid(s) and/or level(s). The dummy array section 1020 includes dummy pillars 1022 supported by a dummy metal fill 1024. The dummy metal fill 1024 can be disposed on top of logic for the memory device (e.g., logic on lower levels W0, W1, etc.). The dummy metal fill 1024 can be configured similar to the dummy metal fills discussed above. For example, the dummy metal fill 1024 can include a via 1026 that connects the dummy metal fill 1024 to a drain in the logic, as discussed above, and thus provides antenna protection. In addition, come portions of the dummy metal fill 1024 can include merge dummy metal fills. In some embodiments, the fill tool can generate the dummy metal fill 1024 of the dummy array section 1020 by using any combination of via dummy metal fills and/or merge dummy metal fills using one or more custom and/or template shapes and/or sizes, as discussed above. The dummy pillars 1022 can be formed using conventional method, but as discussed below, the number of columns can be increased in comparison to conventional systems.

Figure 10B:
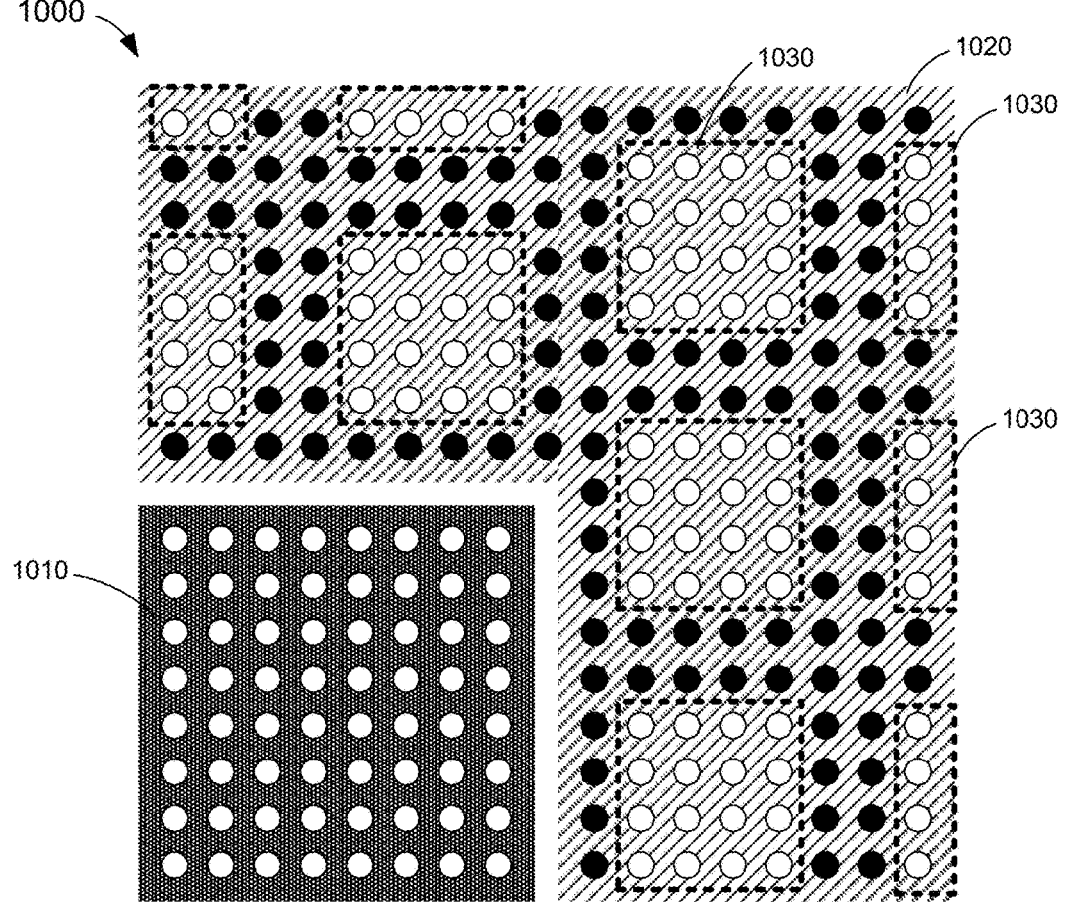

In exemplary embodiments of the present disclosure, the size of the dummy array section 1020 can be larger than conventional dummy array sections. For example, as seen in FIGS. 10A and 10B, the dotted boxes correspond to hypothetical dummy array sections 1030 that represent conventional floating dummy array sections. Because they are floating, the size of the hypothetical dummy array sections 1030 will be limited due to antennal effects and thus are much smaller in comparison to the antenna protected dummy array section 1020. This is because an antenna protected dummy metal fill 1024 can be made larger than a conventional floating dummy metal fill. That is, a size of the dummy metal fill in accordance with embodiment of the present disclosure is greater than a maximum design size of a floating dummy metal fill for the same memory device. In some embodiments, an antenna protected dummy metal fill in accordance with the present disclosure can have a size that is 10,000 times (or more) greater than a maximum design size of a floating dummy metal fill in a same memory device based on design limits (e.g., breakdown voltage, etc.) for the memory device. For example, depending on the design limits of a memory device, in comparison to a maximum design size of a floating dummy metal fill, an antenna protected dummy metal fill can be up to 10,000 times greater in some embodiments, up to 8,000 times greater in other embodiments, and/or up to 6,000 times in still other embodiments. In addition, the floating dummy array sections 1030 must have a minimum design distance X to the live metal 1014 (and/or to other dummy metal fills). But in the embodiment of FIGS. 10A and 10B, because the accumulated charge has a discharge path on dummy metal fill 1024, the minimum design distance can be decreased to Y which can be less than or equal to X and the number of separations between metals (e.g., live metal and/or dummy metal fill) can be decreased (e.g., the configuration may only include one separation between the live metal and the dummy metal fill). Because it is beneficial to have as many columns in a memory array section as possible, as these additional dummy pillars (e.g., dummy memory cells) provide etching, CMP, etc. process margins with uniform stress and patterning, exemplary embodiments of the present disclosure provide patentable advantages over conventional floating memory array sections (higher column density equals smaller memory device size and/or larger memory capacity). As seen in FIG. 10B, because larger dummy metal fill sizes and/or decreased minimum design distances can be used, memory array section 1020 can include a greater number of pillars than the combined number of pillars in floating memory array sections 1030 (e.g., see shaded pillars in FIG. 10B, which represent the pillars that are in addition to conventional non-shaded pillars).

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, or other memory types, etc. The above embodiments are described in sufficient detail to enable those skilled in the art to make and use the embodiments. A person skilled in the relevant art, however, will understand that the technology may have additional embodiments and that the technology may be practiced without several of the details of the embodiments described above.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps may be presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

In one implementation, the instructions for implementing functionality in the rule-based dummy fill tool can be executed by processor 610 (or another processor or processors). While the machine-readable storage medium 630 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A memory device, comprising:
a semiconductor substrate including a plurality of active semiconductor devices; and
a plurality of metallization layers disposed over the semiconductor substrate, each of the plurality of metallization layers separated from adjacent metallization layers by an interlayer dielectric, wherein the plurality of metallization layers comprises a metallization layer comprising:
a first dummy metal fill connected to a first discharge path for dissipating, through a first via conductor, a first charge build up in the first dummy metal fill to minimize antenna effects,
a second dummy metal fill connected to a second discharge path for dissipating, through a second via conductor, a second charge build up in the second dummy metal fill to minimize antenna effects,
a floating dummy metal fill,
first live metal positioned between the first dummy metal fill and the floating dummy metal fill, wherein:
a first minimum distance between the first dummy metal fill and the first live metal is less than a threshold distance based on the first dummy metal fill being connected to the first discharge path,
a second minimum distance between the floating dummy metal fill and the first live metal is greater than or equal to the threshold distance based on the floating dummy metal fill not being connected to any discharge path, and
the first minimum distance between the first dummy metal fill and the first live metal is less than half of the second minimum distance between the floating dummy metal fill and the first live metal, and
second live metal positioned between the second dummy metal fill and the floating dummy metal fill, wherein:
a third minimum distance between the second dummy metal fill and the second live metal is less than the threshold distance based on the second dummy metal fill being connected to the second discharge path, and
a fourth minimum distance between the floating dummy metal fill and the second live metal is greater than or equal to the threshold distance based on the floating dummy metal fill not being connected to any discharge path.

2. The memory device of claim 1, wherein the first discharge path includes the semiconductor substrate, and wherein the semiconductor substrate is an electrical drain.

3. The memory device of claim 1, wherein:
the first via conductor is connected between the first dummy metal fill and at least one of the semiconductor substrate or a third dummy metal fill disposed on a second metallization layer, and
the first discharge path includes the first via conductor.

4. The memory device of claim 3, wherein the first via conductor connects the first dummy metal fill and the third dummy metal fill in an overlap portion of the first dummy metal fill and the third dummy metal fill.

5. The memory device of claim 3, wherein the first dummy metal fill and the third dummy metal fill do not overlap, and wherein a width of the first via conductor is such that the first via conductor connects the first dummy metal fill and the third dummy metal fill.

6. The memory device of claim 1, wherein the first dummy metal fill is disposed within a first grid of the metallization layer associated with a first metal pattern density and the second dummy metal fill is disposed in a second grid of the metallization layer associated with a second metal pattern density.

7. The memory device of claim 1, wherein the first dummy metal fill is not directly connected to an active semiconductor device of the plurality of active semiconductor devices.

8. A method, comprising:
depositing a plurality of metallization layers over a semiconductor substrate of a memory device, each of the plurality of metallization layers separated from adjacent metallization layers by an interlayer dielectric and the semiconductor substrate including a plurality of active semiconductor devices;
depositing a first dummy metal fill in a metallization layer of the plurality of metallization layers;
configuring a first discharge path for the first dummy metal fill for dissipating, through a first via conductor, a first charge build up in the first dummy metal fill to minimize antenna effects;
depositing a second dummy metal fill in the metallization layer;
configuring a second discharge path for the second dummy metal fill for dissipating, through a second via conductor, a second charge build up in the second dummy metal fill to minimize antenna effects;
depositing a floating dummy metal fill in the metallization layer;
depositing first live metal in the metallization layer, the first live metal being positioned between the first dummy metal fill and the floating dummy metal fill, wherein:
a first minimum distance between the first dummy metal fill and the first live metal is less than a threshold distance based on the first dummy metal fill being connected to the first discharge path,
a second minimum distance between the floating dummy metal fill and the first live metal is greater than or equal to the threshold distance based on the floating dummy metal fill not being connected to any discharge path, and
the first minimum distance between the first dummy metal fill and the first live metal is less than half of the second minimum distance between the floating dummy metal fill and the first live metal; and
depositing second live metal in the metallization layer, the second live metal being positioned between the second dummy metal fill and the floating dummy metal fill, wherein:
a third minimum distance between the second dummy metal fill and the second live metal is less than the threshold distance based on the second dummy metal fill being connected to the second discharge path, and
a fourth minimum distance between the floating dummy metal fill and the second live metal is greater than or equal to the threshold distance based on the floating dummy metal fill not being connected to any discharge path.

9. The method of claim 8, wherein the first discharge path includes the semiconductor substrate of the memory device, and wherein the semiconductor substrate is an electrical drain.

10. The method of claim 8, further comprising:

depositing the first via conductor between the first dummy metal fill and at least one of the semiconductor substrate or a third dummy metal fill disposed on a second metallization layer such that the first discharge path includes the first via conductor.

11. The method of claim 8, further comprising:

depositing a merge fill between the first dummy metal fill and a third second dummy metal fill disposed in the metallization layer such that the first discharge path includes the merge fill.

12. The method of claim 8, wherein the first dummy metal fill is not directly connected to an active semiconductor device of the plurality of active semiconductor devices.

13. The memory device of claim 1, wherein the first minimum distance between the first dummy metal fill and the first live metal is less than or equal to half of the threshold distance.

14. The memory device of claim 1, wherein the third minimum distance between the second dummy metal fill and the second live metal is less than half of the fourth minimum distance between the floating dummy metal fill and the second live metal.

15. The memory device of claim 1, wherein the third minimum distance between the second dummy metal fill and the second live metal is less than or equal to half of the threshold distance.

\* \* \* \* \*